(12) United States Patent
Takahara et al.

(10) Patent No.: US 9,035,358 B2
(45) Date of Patent: May 19, 2015

(54) SEMICONDUCTOR ELEMENT

(71) Applicant: Mitsubishi Electric Corporation, Tokyo (JP)

(72) Inventors: Yoshio Takahara, Fukuoka (JP); Takeshi Miura, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 14/275,946

(22) Filed: May 13, 2014

(65) Prior Publication Data

US 2015/0091063 A1  Apr. 2, 2015

(30) Foreign Application Priority Data

Oct. 2, 2013  (JP) ................. 2013-207539

(51) Int. Cl.
*H01L 29/00* (2006.01)
*H01L 29/737* (2006.01)
*H01L 29/66* (2006.01)

(52) U.S. Cl.
CPC ......... *H01L 29/737* (2013.01); *H01L 29/66318* (2013.01); *H01L 29/66242* (2013.01)

(58) Field of Classification Search
CPC ............ H01L 29/41708; H01L 29/7371; H01L 29/66318; H01L 29/2304; H01L 29/0817; H01L 29/205; H01L 29/66242; H01L 29/737
See application file for complete search history.

(56) References Cited

U.S. PATENT DOCUMENTS

| 5,147,775 A * | 9/1992 | Ota et al. ............... 438/317 |
| 2011/0193133 A1 * | 8/2011 | Ogura ..................... 257/184 |

FOREIGN PATENT DOCUMENTS

JP  60-164358 A  8/1985

* cited by examiner

*Primary Examiner* — Colleen A Matthews
*Assistant Examiner* — Quovaunda V Jefferson
(74) *Attorney, Agent, or Firm* — Leydig, Voit & Mayer, Ltd.

(57) ABSTRACT

A semiconductor element includes a collector contact layer of a high concentration N-type semiconductor layer. An N-type collector layer, a base layer, being a high concentration P-type semiconductor layer with a top surface, laminated on the collector layer, and an N-type emitter layer laminated on a part of the top surface, are laminated on the collector contact layer. A base-collector layer junction is located on a bonded surface, between the base layer and the collector layer. An inactive portion is located outside an outside end of a base electrode on the top surface, in a plan view. The inactive portion is formed by implanting ions of one of helium and argon into the first and second semiconductor layers. The inactive portion extends from the top surface to a position below the base-collector layer junction.

9 Claims, 3 Drawing Sheets

SEMICONDUCTOR ELEMENT

BACKGROUND OF THE INVENTION

1. Field of the Invention

The present invention relates to a semiconductor element.

2. Background Art

Heterojunction type bipolar transistors (hereinafter, referred to as "HBT") used for conventional high frequency power amplifiers are generally configured as shown in FIG. 5. FIG. 5 is a diagram of a semiconductor element having a typical HBT structure illustrating problems to be solved by the present invention. The HBT shown in FIG. 5 is provided with an emitter layer 111 formed of an N-type semiconductor, an emitter electrode 112, a base electrode 113, a base layer 114 formed of a high concentration P-type semiconductor, a collector layer 115 formed of an N-type semiconductor, a collector ohmic layer 116 formed of a high concentration N-type semiconductor and a collector electrode 117.

In this HBT, a base-collector junction 118 is formed between the P-type base layer 114 and the N-type collector layer 115. In order to reduce a junction capacitance (Cbc) and improve high frequency characteristics (maximum oscillating frequency fmax or the like), this base-collector junction 118 is preferably as small as possible. For this reason, it is preferable to minimize the size of a PN junction end 119 located outside the base electrode 113.

The base layer may be etched by wet etching or dry etching When wet etching is used, dihydroxysuccinic acid/hydrogen peroxide or phosphoric acid/hydrogen peroxide may be used. When this base layer is worked out, care needs to be exercised to ensure that the base electrode may be avoided from the etched region. For this reason, an etching edge needs to be formed at a position away from the base electrode to a certain extent, and more specifically, a design needs to be conducted for providing an interval of 0.5 μm or more in consideration of dimensional controllability over a resist used during etching and a problem with accuracy of alignment with the base electrode. Thus, it is practically impossible to provide an etching end of the PN junction end 119 directly below the base electrode 113.

Note that when using dry etching, a technique may also be used whereby the base layer is worked out through dry etching with self-alignment using the base electrode as a mask so as to obtain a minimum base-collector junction area. However, Au is generally used as a base electrode material, and etching is performed using Au as a mask in this case. This may result in a problem with Au contamination of the dry etching apparatus or a problem that the device itself is contaminated by Au during etching, and therefore etching is not a process that allows mass production, and the aforementioned wet etching is in the mainstream in mass production sites.

Furthermore, in the HBT structure shown in FIG. 5, like an end 1110, the base-collector junction is exposed on the surface at the end where the base layer is worked out. For this reason, there are problems that the surface state is not stable and a leakage current between the base and collector is not stable or the like.

In this regard, as disclosed, for example, in Japanese Patent Laid-Open No. S60-164358, there is a technique whereby ions are injected into a base-collector semiconductor layer formed outside a base electrode using the base electrode as a mask to thereby produce inactivation.

However, the above-described conventional technique achieves inactivation through implementation of high resistance by injecting hydrogen ions ($H^+$), oxygen ions ($O^+$), boron ions ($B^+$) into the base-collector semiconductor layer formed outside the base electrode. For example, $H^+$ remaining in the base layer has an influence on impurities in the base layer, causing a current gain β of the HBT to fluctuate. $O^+$ and $B^+$ may become impurities, resulting in a problem with insulating properties.

Thus, the above-described conventional inactivation technique is a technique yet to be improved from the perspective of securing reliability of a semiconductor element by stabilizing a side face of the semiconductor layer.

SUMMARY OF THE INVENTION

The present invention has been implemented to solve the above-described problem and it is an object of the present invention to reduce a junction capacitance and provide a semiconductor element with stabilized a side face of a semiconductor layer.

According to one aspect of the present invention, a semiconductor element includes: a first semiconductor layer having a first conductivity type and a first side face; a second semiconductor layer laminated on the first semiconductor layer, the second semiconductor layer having a second conductivity type, a top surface and a second side face; a third semiconductor layer laminated on a part of the top surface, the third semiconductor layer having the first conductivity type; a first electrode electrically connected to the first semiconductor layer; a second electrode provided on another part of the top surface so as to surround the third semiconductor layer; and a third electrode provided on the third semiconductor layer. An inactive portion is provided outside an outside end of the second electrode on the top surface in a plan view. The inactive portion is formed by injecting ions of one element selected from a group of helium and argon into the first and second semiconductor layers. The inactive portion extends from the top surface down to a position below a junction of the first and second semiconductor layers.

Other and further objects, features and advantages of the invention will appear more fully from the following description.

DETAILED DESCRIPTION OF THE PREFERRED EMBODIMENTS

Figure 1:
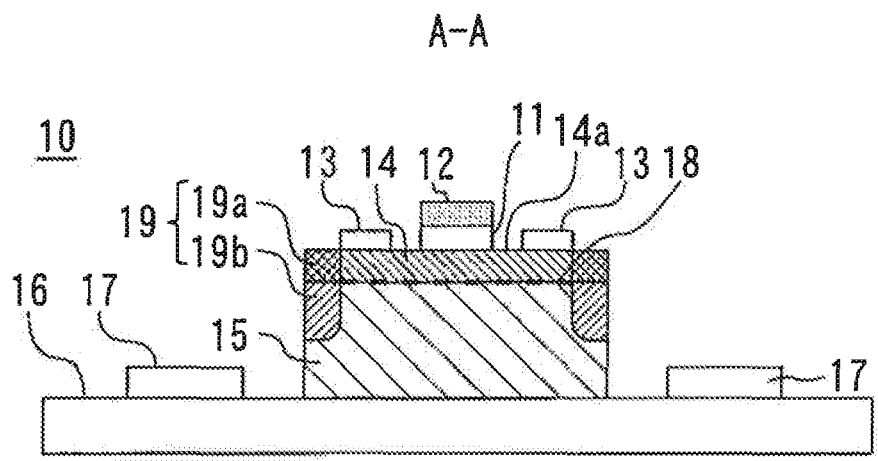
FIG. 1 is a diagram illustrating a semiconductor element according to an embodiment of the present invention.
Figure 2:
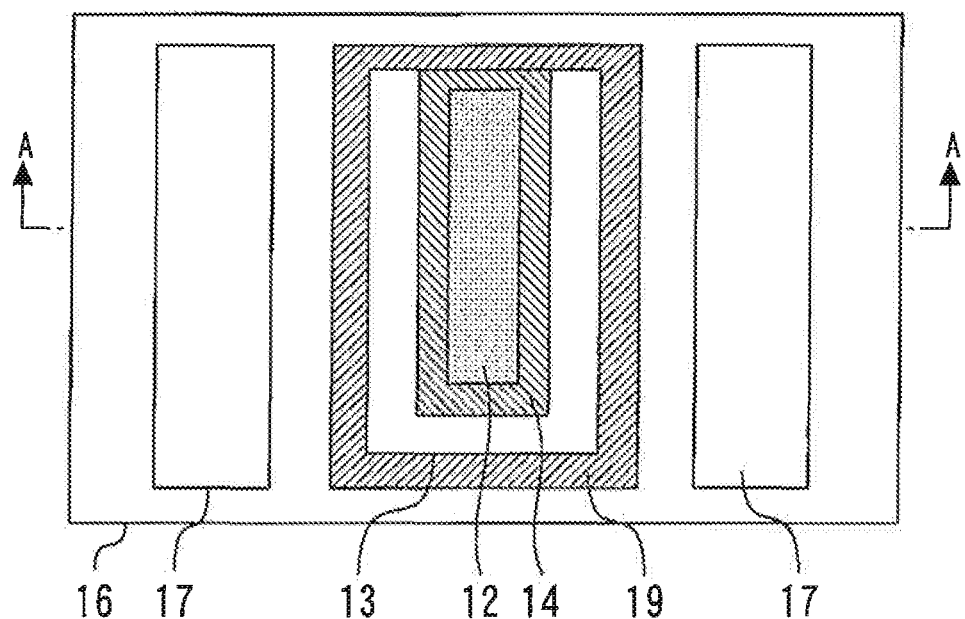
FIG. 2 is a diagram illustrating a semiconductor element according to an embodiment of the present invention.

FIG. 1 is a cross-sectional view illustrating a semiconductor element 10 according to an embodiment of the present invention. FIG. 2 is a plan view illustrating the semiconductor element 10 according to the embodiment of the present invention. FIG. 1 corresponds to the semiconductor element 10 cut along a line A-A of FIG. 2.

The semiconductor element 10 is a GaAs-based heterojunction type bipolar transistor (HBT) used for a high frequency power amplifier. The semiconductor element 10 is provided with a collector contact layer 16 formed of a high concentration N-type semiconductor layer. An N-type collector layer 15, a base layer 14, and an N-type emitter layer 11 are laminated on the collector contact layer 16. The base layer 14 is a high concentration P-type semiconductor layer and is laminated on the collector layer 15. The base layer 14 is provided with a top surface 14a. The emitter layer 11 is laminated on a part of the top surface 14a. A base-collector layer junction 18 is formed on a bonded surface between the base layer 14 and the collector layer 15.

Two collector electrodes 17 are provided on the collector contact layer 16 so as to sandwich the collector layer 15. An emitter electrode 12 is provided on the emitter layer 11. A base electrode 13 is provided on another part of the top surface 14a so as to surround the emitter layer 11.

An inactive portion 19 is provided outside an outside end of the base electrode 13 on the top surface 14a in a plan view. The inactive portion 19 is made up of a base inactive portion 19a which is an inactivated base layer 14 and a collector inactive portion 19b which is an inactivated collector layer 15. The inactive portion 19 is formed by injecting ions of one element selected from a group of helium and argon into the collector layer 15 and the base layer 14. The inactive portion 19 extends from the top surface 14a down to a position below the base-collector layer junction 18.

In the first embodiment in particular, as is clear from the cross-sectional view in FIG. 1, the inactive portion 19 is provided from the top end of the side face of the base layer 14 down to some midpoint of the side face of the collector layer 15 in a cross-sectional view. Therefore, the end of the inactive portion 19 is terminated near the center of the collector layer 15.

Furthermore, as is clear from the plan view in FIG. 2, the inactive portion 19 continuously surrounds the base electrode 13 in a plan view.

The present embodiment provides the inactive portion formed by injecting ions of one element selected from a group of helium and argon into the base-collector layer junction which is a semiconductor layer junction provided outside the base electrode. This makes it possible to reduce the area of the base-collector layer junction, and thereby reduce a junction capacitance (Cbc) and stabilize the side face of the base-collector layer junction.

Since the inactive portion 19 is insulated, no PN junction exists in an outer peripheral end of the base-collector layer junction 18. It is thereby possible to reduce the area of the base-collector layer junction 18 and reduce an effective PN junction area. Moreover, the PN junction is exposed on the semiconductor layer surface before the inactivation. For this reason, when an electric field is applied to the base-collector junction, a semiconductor interface section is susceptible to electric field dependency caused a process variation. In this respect, according to the present embodiment, it is possible to stabilize influences of the electric field through insulation injection.

The present embodiment provides the inactive portion 19 through insulation injection of helium ions (He$^+$) and/or argon ions (Ar$^+$) which are inactive ions. Using ion injection of these inactive elements, it is possible to form the stable inactive portion 19 without reliability degradation.

When injecting ions for forming the inactive portion 19, the present embodiment prevents the inactive portion 19 from reaching the collector contact layer 16 which is the high concentration N-type semiconductor layer. This may be formed with injection acceleration energy and the amount of injection for insulating the base layer 14 from within the collector layer 15. This prevents deterioration of the electrical characteristics of the HBT.

The prevention of deterioration of the electrical characteristics of the HBT will be described. First, as a general operation of the HBT, the emitter is set to a GND potential, a current is applied to the base electrode and a collector voltage is applied thereto. In this case, the collector current flows through a route from the collector electrode 17, the collector contact layer 16 of a high concentration N-type semiconductor, the collector layer 15 made up of an N-type semiconductor→the base layer 14 made up of a P-type semiconductor→the emitter layer 11 made up of an N-type semiconductor→the emitter electrode 12.

Here, if insulation injection is applied down to the collector contact layer 16 of the high concentration N-type semiconductor, the resistance of the collector contact layer 16 whose concentration has been increased to achieve low resistance increases. The resistance between the collector and the emitter of the HBT then increases, leading to an increase of the ON resistance in particular and deterioration of the transistor characteristics. The present embodiment prevents the inactive portion 19 from reaching the collector contact layer 16, and can thereby prevent deterioration of the electrical characteristics of the HBT.

A maximum oscillating frequency fmax which is an index of high frequency characteristics is expressed by the following expression.

$$fmax \propto (1/Cbc)^{1/2}$$

By reducing the area S of the PN junction, it is possible to reduce the junction capacitance (Cbc) of the base-collector layer junction 18. Since other HBT active regions are not affected, an improvement of high frequency characteristics such as speed enhancement and low power consumption can be expected with the main characteristics of the HBT as a single unit remaining unchanged. Furthermore, since the unstable semiconductor interface state is stabilized, a leakage current caused by the instability of the surface between the base and the collector can be prevented and low power consumption can thereby be expected.

Figure 3:
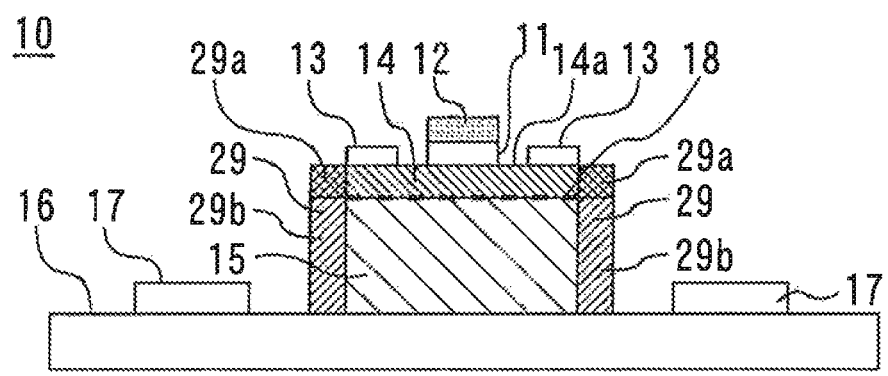
FIG. 3 is a diagram illustrating a semiconductor element according to an embodiment of the present invention.

FIG. 3 is a diagram illustrating a semiconductor element according to an embodiment of the present invention. In the modification shown in FIG. 3, an inactive portion 29 extends to a boundary between the collector contact layer 16 and the collector layer 15. That is, the entire side face of the collector layer 15 is inactivated. The inactive portion 29 is constructed of a base inactive portion 29a which is an inactivated base layer 14 and a collector inactive portion 29b which corresponds to the collector layer 15 whose entire side face side is inactivated. Note that a plan-view shape thereof is the same as that in FIG. 2.

Figure 4:
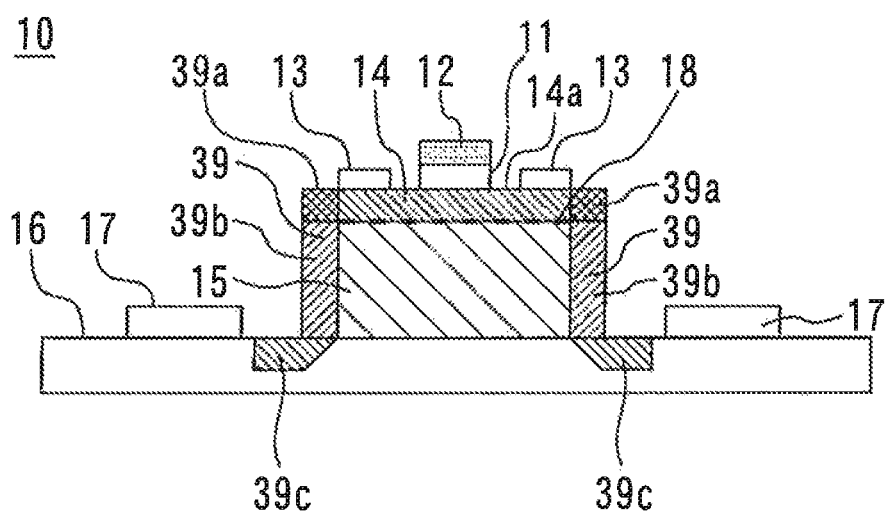
FIG. 4 is a diagram illustrating a semiconductor element according to an embodiment of the present invention.
Figure 5:
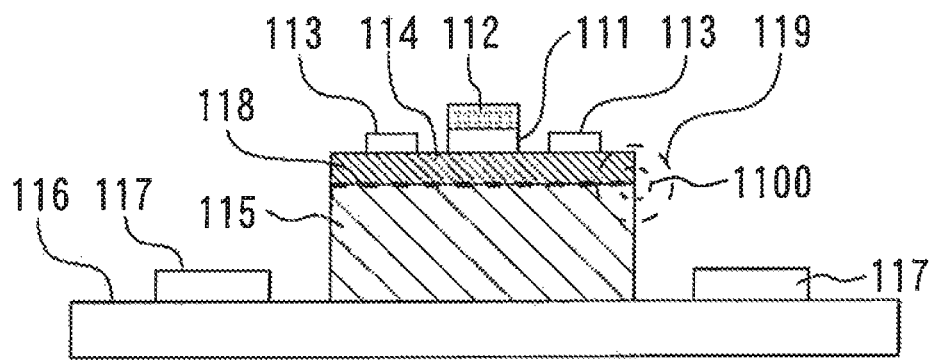
FIG. 5 is a diagram of a semiconductor element having a typical HBT structure illustrating problems to be solved by the present invention.

FIG. 4 is a diagram illustrating a semiconductor element according to the embodiment of the present invention. In the modification shown in FIG. 4, an inactive portion 39 extends to within the collector contact layer 16. That is, the side face of the base layer 14, the side face of the collector layer 15 and a part of the top surface of the collector contact layer 16 are inactivated. The inactive portion 39 is constructed of a base inactive portion 39a which is an inactivated base layer 14, a collector inactive portion 39b which is an inactivated collector layer 15 and a collector contact inactive portion 39c which is an inactivated collector contact layer 16. Note that a plan-view shape thereof is the same as that in FIG. 2.

The features and advantages of the present invention may be summarized as follows. According to the present invention, it is possible to reduce the areas of the first and second semiconductor layer junctions, reduce the junction capacitance and also stabilize side faces of the first and second semiconductor layers.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2013-207539, filed on Oct. 2, 2013 including specification, claims, drawings and summary, on which the Convention priority of the present application is based, is incorporated herein by reference in its entirety.

What is claimed is:

1. A semiconductor element comprising:
   a first semiconductor layer having a first conductivity type and a first side face;
   a second semiconductor layer laminated on the first semiconductor layer, the second semiconductor layer having a second conductivity type, a top surface, and a second side face;
   a third semiconductor layer laminated on a first part of the top surface, the third semiconductor layer having the first conductivity type;
   a first electrode electrically connected to the first semiconductor layer;
   a second electroded located on a second part of the top surface and surrounding the third semiconductor layer; and
   a third electrode located on the third semiconductor layer; wherein
      an inactive portion is located outside an outside end of the second electrode, on the top surface, as seen in a plan view,
      the inactive portion is formed by implanting ions of one element, selected from the group consisting of helium and argon, into the first and second semiconductor layers, and
      the inactive portion extends from the top surface, on one side of a junction of the first and second semiconductor layers, to a position on an opposite side of the junction of the first and second semiconductor layers.

2. The semiconductor element according to claim 1, wherein the inactive portion extends from a top end of the second side face to a midpoint of the first side face in a cross-sectional view.

3. The semiconductor element according to claim 2, wherein the inactive portion continuously surrounds the second electrode, in a plan view.

4. The semiconductor element according to claim 2, further comprising a third semiconductor layer, wherein
   the semiconductor element is a heterojunction bipolar transistor,
   the first semiconductor layer is a collector layer,
   the second semiconductor layer is a base layer,
   the third semiconductor layer is an emitter layer,
   the first electrode is a collector electrode,
   the second electrode is a base electrode, and
   the third electrode is an emitter electrode.

5. The semiconductor element according to claim 1, wherein the inactive portion continuously surrounds the second electrode, in a plan view.

6. The semiconductor element according to claim 5, further comprising a third semiconductor layer, wherein
   the semiconductor element is a heterojunction type bipolar transistor,
   the first semiconductor layer is a collector layer,
   the second semiconductor layer is a base layer,
   the third semiconductor layer is an emitter layer,
   the first electrode is a collector electrode,
   the second electrode is a base electrode, and
   the third electrode is an emitter electrode.

7. The semiconductor element according to claim 1, further including a third semiconductor layer, wherein
   the semiconductor element is a heterojunction bipolar transistor,
   the first semiconductor layer is a collector layer,
   the second semiconductor layer is a base layer,
   the third semiconductor layer is an emitter layer,
   the first electrode is a collector electrode,
   the second electrode is a base electrode, and
   the third electrode is an emitter electrode.

8. The semiconductor element according to claim 1, further comprising a contact layer on which the first semiconductor layer is laminated, wherein the inactive portion extends to a boundary between the contact layer and the first semiconductor layer.

9. The semiconductor element according to claim 1, further comprising a contact layer on which the first semiconductor layer is laminated, wherein the inactive portion extends to within the contact layer.

* * * * *